United States Patent
Reder et al.

(10) Patent No.: US 6,649,537 B1
(45) Date of Patent: Nov. 18, 2003

(54) INTERMITTENT PULSED OXIDATION PROCESS

(75) Inventors: Steven E. Reder, Boring, OR (US); Hemanshu D. Bhatt, Penang (MY)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/044,215

(22) Filed: Nov. 19, 2001

(65) Prior Publication Data (65)

(51) Int. Cl.⁷ .............................. H07L 21/31
(52) U.S. Cl. ............... 438/770; 438/308; 438/591; 438/760; 438/761; 438/762; 438/913
(58) Field of Search ................. 438/308, 591, 438/760–2, 770, 913

(56) References Cited

U.S. PATENT DOCUMENTS

| | | | | |
|---|---|---|---|---|
| 5,869,405 A | * | 2/1999 | Gonzalez et al. | 438/770 |
| 5,880,040 A | * | 3/1999 | Sun et al. | 438/769 |
| 5,972,800 A | * | 10/1999 | Hasegawa | 438/761 |
| 6,114,258 A | * | 9/2000 | Miner et al. | 438/787 |
| 6,200,872 B1 | * | 3/2001 | Yamada | 438/308 |

* cited by examiner

Primary Examiner—Kamand Cuneo
Assistant Examiner—Lisa Kilday
(74) Attorney, Agent, or Firm—Beyer Weaver & Thomas, LLP

(57) ABSTRACT

The present invention provides a method of forming a dielectric on a semiconductor substrate. A dielectric is grown at a substrate interface in a plurality of increments. Stress is relieved at the dielectric substrate interface between each increment. In another aspect, stress relief is performed by annealing the substrate. The annealing is performed by placing the substrate in an inert environment and by raising the temperature surrounding the substrate.

18 Claims, 3 Drawing Sheets

US 6,649,537 B1

INTERMITTENT PULSED OXIDATION PROCESS

BACKGROUND OF THE INVENTION

1. Field of the Invention

The present invention relates to techniques for forming oxides on silicon for use as semiconductor devices. More particularly, the present invention relates to methods for forming and annealing oxides in intermittent steps.

2. Description of the Related Art

In conventional semiconductor device processing schemes, oxidizing environments create oxide layers on silicon or other substrates. The oxidizing environments are typically created in wafer batch processors such as horizontal or vertical furnaces or in single wafer rapid thermal processors. The oxide is conventionally grown in a single step of a multi-step process. In the horizontal or vertical furnaces, the wafers are loaded into quartz, polysilicon, or silicon carbide boats and exposed to the oxidizing ambient in the furnace for a predetermined period of time. The oxidizing environment is purged by displacement using an inert gas such as nitrogen or argon, when the desired oxide thickness is achieved. The oxidizing environment conventionally performs one of dry oxidation ($O_2$), wet oxidation ($O_2+H_2$), dry oxidation with a chlorine source ($O_2+HCl$), and nitric oxide oxidation (NO), depending on the characteristics sought for the oxide.

An anneal step is typically performed at the end of the oxidation, after the final oxide thickness is achieved. During the oxidation step, stresses are built up in the oxide film, particularly at the oxide-silicon interface. Annealing provides stress relief for the oxide. However, particularly as the critical dimensions of semiconductor devices decrease, conventional methods may not satisfactorily reduce the stress levels in the oxide and at the oxide-silicon interface. Defects in thinner oxides tend to occur at the silicon-(substrate)-oxide interface. This contributes to higher defect levels in the oxides than desired, i.e. an unacceptably low oxide integrity and may produce an unreliable gate oxide. One measure of the reliability and the quality of the oxide is the Time Dependent Dielectric Breakdown (TDDB) lifetime which is related to the time required before a voltage applied to a gate oxide causes the breakdown of the oxide. Higher integrity oxides exhibit longer TDDB lifetimes and are often coveted by customers Accordingly, it is desirable to provide an improved oxidizing process that will provide higher oxide integrity and more reliable devices.

SUMMARY OF THE INVENTION

To achieve the foregoing, the present invention provides a process of forming an oxide on a substrate in increments. In the process, wafer(s) are loaded into a thermal reactor and exposed to an oxidizing ambient for a predetermined period of time. The predetermined period is selected such that the oxide layer formed falls short of the desired oxide thickness. The oxidizing ambient is then turned off and an inert gas purge is introduced into the reactor. The wafers are then subjected to an annealing step in the reactor at a selected temperature, thus allowing stress relief The process of oxidizing and annealing in increments ("pulsed oxidation") is repeated until the desired oxide thickness is achieved. The process permits the oxide layer to be grown and annealed in increments, thus permitting stress relief to occur at one or more stages before the final oxide thickness is achieved.

In one aspect, the invention provides a method of forming an oxide on a semiconductor substrate. A dielectric is grown at a substrate interface in a plurality of increments. Stress is relieved at the dielectric substrate interface between each increment.

In another aspect, stress relief is performed by annealing the substrate. The annealing is performed by placing the substrate in an inert environment and by raising the temperature surrounding the substrate.

In yet another aspect, growing the dielectric comprises exposing the substrate to an oxidizing ambient. The oxidizing ambient comprises one of dry oxidation ($O_2$), wet oxidation ($O_2+H_2$), dry oxidation with a chlorine source, nitrous oxide ($N_2O$) and nitric oxide (NO). The use of $N_2O$ or NO is dependent on the desired characteristics of the device performance.

In yet another aspect, a first increment of growing the dielectric comprises exposing the substrate to a first oxidizing ambient and a second increment comprises exposing the substrate to a second oxidizing ambient. The first oxidizing ambient is different from the second oxidizing ambient.

In yet another aspect, the first oxidizing ambient is the same as the second oxidizing ambient.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as maybe included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a process of forming an oxide on a substrate in increments. In the process, wafers are loaded into a thermal reactor and exposed to an oxidizing ambient for a predetermined period of time. The predetermined period is selected such that the oxide layer formed falls short of the desired oxide thickness. The oxidizing ambient is then turned off and an inert gas purge is introduced into the reactor. The wafers are then subjected to an annealing step in the reactor at a selected temperature, thus allowing stress relief. The process of oxidizing and annealing in increments ("pulsed oxidation") is repeated until the desired oxide thickness is achieved. The process permits the oxide layer to be grown and annealed in increments, thus permitting stress relief to occur at one or more stages before the final oxide thickness is achieved.

The periodic stress relief provided to the grown oxide film increment and the associated oxide-silicon interface is believed to reduce overall film stress. Devices having lower film stresses, particularly at the oxide-silicon interface, exhibit lower defect densities, higher oxide integrities, and produce more reliable devices. Many different types of defects (e.g., silicon defects, oxide bulk defects, and oxide pinholes) may weaken the silicon-oxide interface. The incremental growth and annealing of the oxide film is believed to allow a more orderly alignment of the oxide-silicon interface and thus a reduction in the density of defects. Moreover, the improved oxide integrity and other advantages as described are achieved without changing the process tool.

Figure 1A:
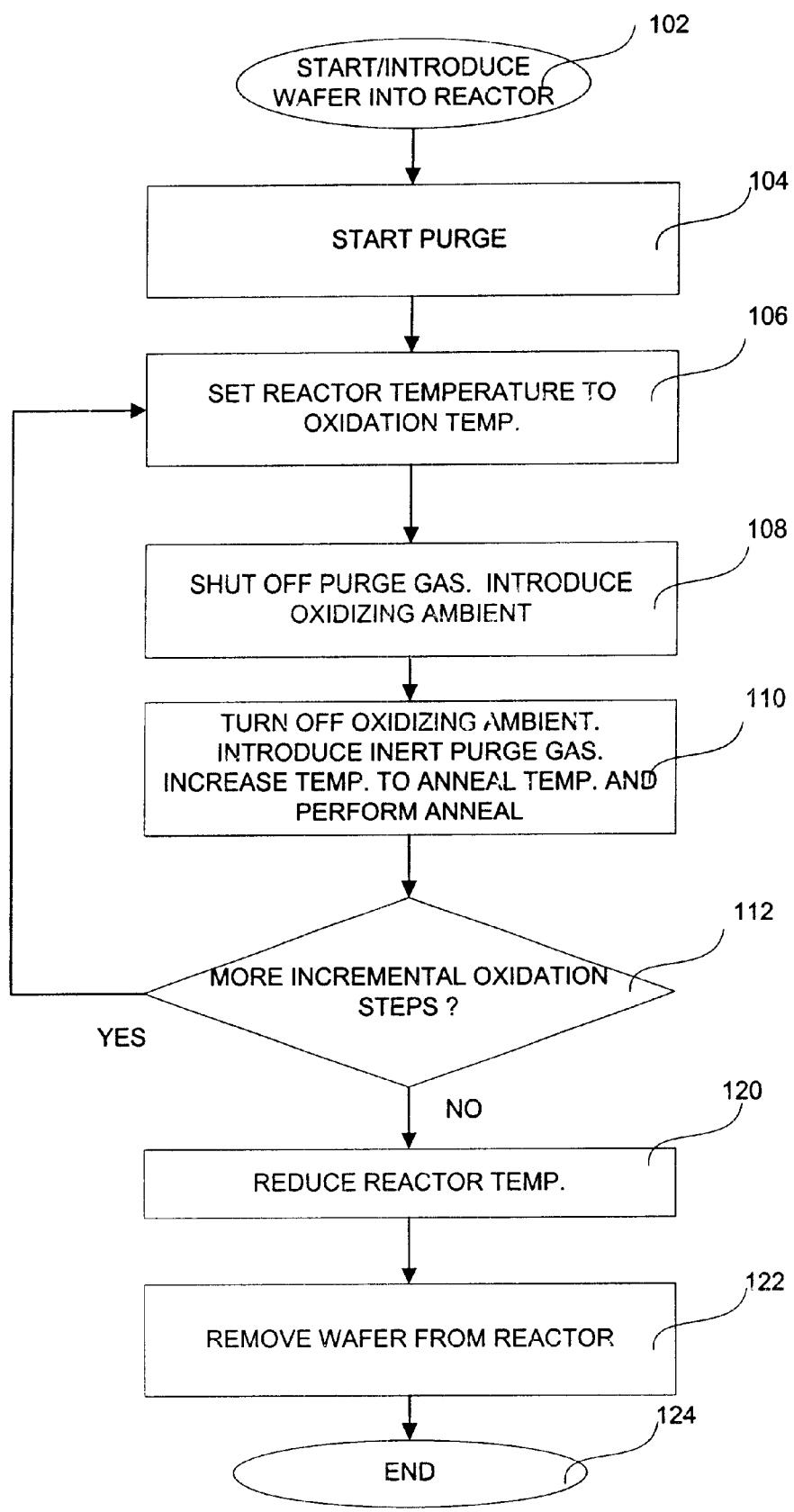
FIG. 1A is a flowchart depicting the steps in formation of a dielectric in accordance with one embodiment of the present invention.

FIG. 1A is a flowchart depicting the steps in formation of a dielectric in accordance with one embodiment of the present invention. The process commences with the introduction of the wafer into the reactor (102). In a specific embodiment, the reactor is a rapid thermal processor having a limited volume, thus permitting a rapid exchange of gases. Rapid thermal processors are typically designed to accommodate only a single wafer or alternatively a limited number of wafers. The single wafer processor is characterized by its relatively small volume compared to batch processors (e.g. horizontal and vertical furnaces) and provides the advantage of enabling the reactor vessel to be filled with gases such as the oxidizing ambient rapidly. When used with the processes of the present invention, the rapid thermal processor provides advantages of increased control over the times of exposure to the oxidizing ambient and additionally the ability to purge the reactor vessel rapidly.

The process of the present invention may also be used with batch processors such as horizontal and vertical batch furnaces. An example of such a batch furnace is the SVG Thermco AVP 8000, an advanced vertical processor manufactured by SVG Thermco of Orange, Calif.

The rapid thermal processor provides some advantages over batch processors in employing the processes of the present invention including the rapid gas exchanges available. Several manufacturers provide rapid thermal processors including Applied Materials of Santa Clara, Calif. Batch furnaces may load as many as 20 or more wafers into the furnace at one time. The increased volume required in the batch furnace requires larger volumes of gases to be exchanged in the numerous process steps and a longer time period to achieve the exchanges. The mass of the wafers involved also requires longer time periods for temperature stabilization and may result in nonhomogenous temperatures and oxidizing environments faced by the batch of wafers. Many of these problems are present in the conventional oxidation employed in batch furnaces. Despite these disadvantages, the incremental oxidation/anneal steps of the present invention are expected to provide an oxide of increased quality over conventional oxidation processes in batch furnaces. The processes of the present invention are therefore intended to apply to all oxidizing reactors, whether single wafer or multiple wafer types.

The purge gas is then introduced to purge out the ambient environment (104). Typical purge gases comprise $N_2$ but may be any of several inert gases known to those of skill in the art and used in conventional process steps. A small partial percentage of oxygen may be present during the purge step. Pressure during the purge is typically atmospheric to subatmospheric.

The reactor temperature is then set to the oxidation process temperature while the purge gas continues to flow (106). This permits oxidation at the desired temperature to commence immediately when the oxidizing ambient is later introduced and this provides better control over the oxide growth process. Suitable temperatures range from about 600 to 1000 degrees C. Once the wafers are stabilized at the desired oxidizing temperature, the purge gas is shut off and the process (oxidizing or nitridizing) ambient gas introduced into the reactor (108). The oxidizing ambient is introduced for a finite period of time. The finite period of time is determined by the incremental oxide thickness desired to be grown during the oxidizing interval. The oxidizing ambient is determined by the process requirements. As known to those of skill in the art a variety of process ambients are available with distinct advantages and disadvantages presented by each. For example, the oxidizing ambient may be selected to achieve dry oxidation, wet oxidation, dry oxidation accentuated with a chlorine source, or alternately a nitridizing ambient selected using a nitric oxide step. Selection of the oxidizing ambient may be important to achieve the desired oxide characteristics. For example, threshold voltage ($V_t$) of a device can be detrimentally affected by a nonuniform oxide layer. Differences in gate oxide thickness of as little as 2 Angstroms may produce a noticeable change in the device's $V_t$. Generally dry oxidation yields a more uniform oxide and better $V_t$ control. A wet oxidizing ambient (steam) produces a higher quality oxide but also produces a high growth rate of the oxide. An oxidizing ambient using chlorine reduces contamination in the oxide. Chlorine acts as a gettering agent and ties up mobile components that might contaminate the oxide.

Next, the oxidizing ambient is turned off and an inert purge gas turned on and introduced into the reactor (110). Introduction of the purge gas permits rapid purging of the oxidizing ambient to rapidly stop the oxidation of the substrate. During this step, the temperature of the reactor may be increased to the temperature desired for annealing of the oxide film. Suitable anneal temperatures are about 50 to 100 degrees C. higher than the oxidation temperatures. During this step the anneal is performed.

A determination is then made as to whether further incremental oxidation and annealing steps are desired (112). The thickness of each incremental oxide layer is determined by the overall thickness desired and the number of incremental oxide steps desired. For example, three incremental oxide and annealing steps may provide suitable results in one embodiment. However, the invention is not intended to be limited to such an embodiment. Those skilled in the art with the benefit of this specification will realize that as few as two increments up to an unlimited number of increments may be implemented without departing from the spirit of the invention. Preferably the oxide thickness will be at least a monolayer in dimension, i.e., 4 to 6 Angstroms in thickness. If further incremental oxidation and annealing steps are desired steps 106 to 112 are repeated until the desired number and/or thickness of oxide growth is achieved. Each succeeding incremental oxidation will commence by reducing the temperature in the reactor to the oxidation temperature (106). The present invention provides flexibility advantages in achieving desired oxide film characteristics by selecting different oxidizing ambients in each incremental oxidation step. For example, in a three step process of repeated incremental oxidation/annealing, the initial oxidation may be dry oxidation, followed by wet oxidation and finally a chlorinated dry oxidation. This example is illustrative and not intended to be limiting. The combination of different oxidizing ambients provide flexibility in achieving the desired oxide characteristics. For example, dry oxidation may initially be chosen to produce a uniform passivation layer in the first oxidation increment and combined with a chlorinated oxidation gas in the second oxidation increment to reduce contamination in the oxide.

Once the desired dimensions are achieved, i.e. after the final anneal step (110), the reactor temperature is reduced (120). The wafer is then removed from the reactor (122) and the process ends (124). Wafers are typically withdrawn from the reactor using an automated wafer handler.

Figure 1B:
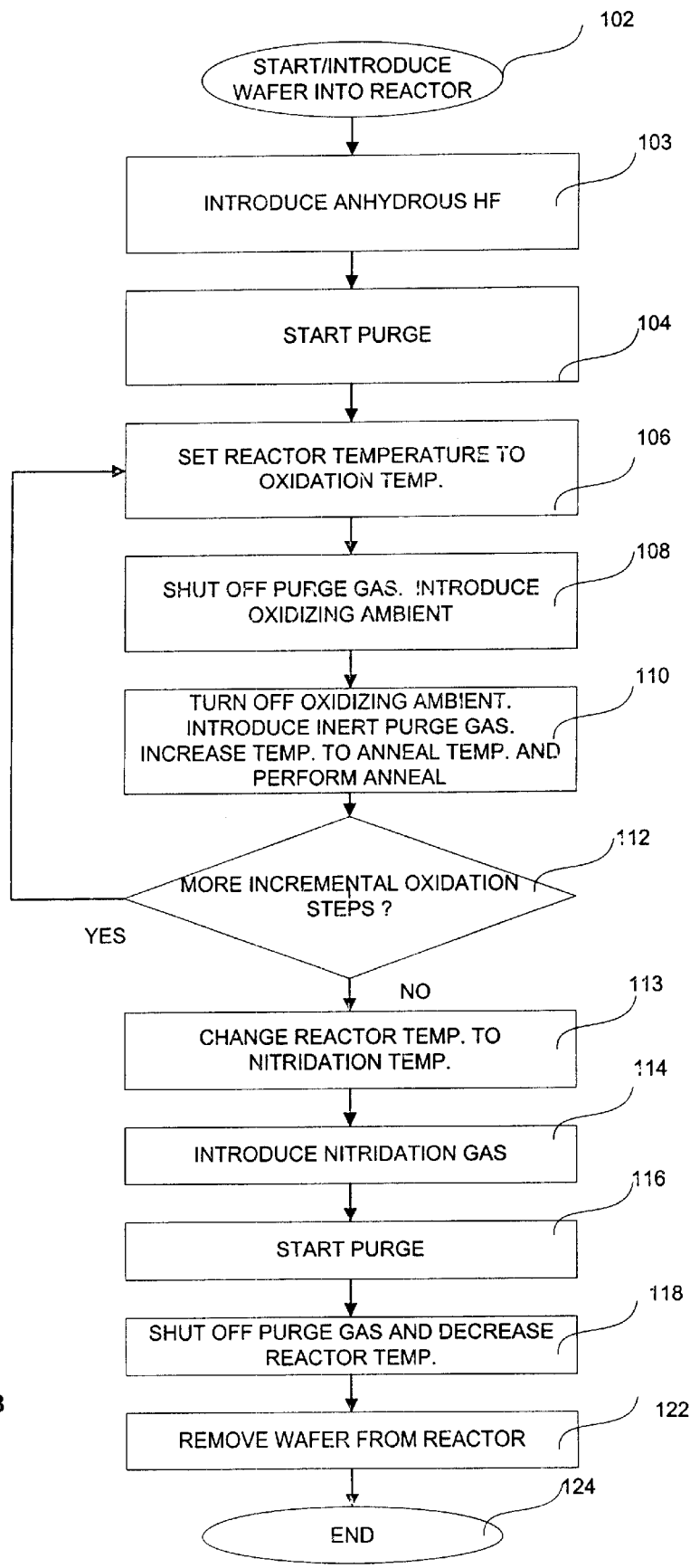
FIG. 1B is a flowchart depicting the steps in formation of a dielectric in accordance with another embodiment of the present invention.

FIG. 1B is a flowchart depicting the steps in formation of a dielectric in accordance with another embodiment of the present invention. The process commences with the introduction of the wafer into the reactor (102). Any wafer exchange or loading ambient is purged with an inert gas such as nitrogen ($N_2$). Alternately, the loading ambient may be evacuated by using one of many conventional methods known to those of skill in the art to produce a low pressure sub-atmospheric condition in the reactor. In one embodiment, a vacuum venturi or mechanical type pump is used to produce the low pressure environment. Anhydrous HF may then be introduced into the reactor to remove any native silicon dioxide on the surface of the silicon wafer prior to oxidation (103). Anhydrous HF is an etchant gas for removal of any native oxide. Other gases having similar oxide etching properties may be used. Typically the wafers may form a native oxide during a precleaning process or due to exposure to ambient conditions in the waiting time or during transport of the wafer to the reactor. A suitable process temperature for the HF cleaning step is room temperature. A reactor pressure is preselected in accordance with a process recipe. The removal of this native oxide is important to gain greater control over the integrity of the oxide. After the wafer has soaked in the HF mixture for the desired time period, the gas may be evacuated using typically a vacuum.

Next the purge step occurs using an inert gas (104) to purge the reactor of residual etchant gases and byproducts. Suitable temperatures and pressures may be controlled by closed loop pressure control and closed loop temperature control such as at or slightly above room temperature in one embodiment. Pressure would be at sub-atmospheric conditions, typically in the range of 1 to 700 torr.

The process proceeds with the setting of the reactor temperature, raised at a controlled rate in one embodiment to the desired oxidation temperature (106). The temperature is defined by the final desired oxidation thickness and process requirements. For example, suitable temperature ranges would fall in the 600 to 1000 degrees C. range but other temperatures, depending on the process requirements and oxide characteristics might fall outside this range without departing from the scope of this invention. Generally lower temperatures in the range produce oxide growth at a slower rate.

Oxygen or a mixture of $O_2$ and an inert diluent gas or steam may be introduced as the oxidizing ambient (108). These gases may be introduced at atmospheric or subatmospheric pressure to form an initial thin layer, in one embodiment a monolayer of oxidation material, to passivate the substrate surface. The monolayer may be in the range of about 1 to 2 molecules thick, enough to cover the substrate with a conforming layer. The monolayer would be expected to be from 4 to 6 Angstroms in thickness. This initial oxidation increment may be described as a preoxidation and protects against the effects of additional gases to be used in the processing. As described with reference to the flowchart illustrated in FIG. 1A, the oxidizing ambient is turned off and an inert purge gas is introduced (110). The temperature is also increased in this step to the anneal temperature and the anneal performed. During the inert gas purge process step the temperature of the reactor may be raised to a temperature of about 50 to 100 degrees C. above the oxidation temperature. This permits annealing of the oxide to relieve the stress at the silicon-oxide interface.

Following the above described preoxidation and anneal, further oxidation steps are required (112). Control is directed to the step where the reactor temperature is decreased from the anneal temperature to the oxidizing temperature (106). Steps 106 to 112 are repeated for this subsequent oxidation/anneal increment. Following stabilization at the desired oxidation temperature, the purge gas is shut off and the oxidizing ambient introduced (108). As described above with reference to FIG. 1A, oxidation may be achieved using one of many conventional methods known to those of skill in the art including but not limited to the use of $O_2$, $H_2+O_2$, HCl, $N_2$ or any ratio of the listed gases to grow the oxide to the desired thickness in this incremental oxidation step. At the completion of the oxidation step, the oxidizing ambient gases are purged from the reactor using an inert ambient to displace the oxidizing ambient (110). The introduction of the inert gas stops the oxidation process. The temperature is increased to the anneal temperature as described above.

The oxidation/anneal incremental steps (steps 106 to 110) may be repeated as many times as necessary to achieve the desired oxide thickness. It is desirable to control the oxidation/anneal incremental steps to produce a relatively thin (e.g., a few molecular layers thick) stress and defect free oxide, i.e., having a high integrity.

In one embodiment, once the desired oxide thickness is achieved using the oxidation/anneal incremental steps, a nitrided barrier layer may be introduced. At the completion of the purge sequence in step 110, a mixture of a nitrogen source gas (e.g. nitric oxide (NO) or nitrous oxide ($N_2O$) gas and another inert gas, for example, one of argon or nitrogen ($N_2$), may be introduced into the reactor at a preselected partial pressure to achieve the desired nitrogen rich oxide layer (114). This nitridation may be performed at either atmospheric or sub-atmospheric pressures and at temperatures ranging form about 600 to 1000 degrees C. At the completion of the nitridation step, a purge with an inert gas is commenced (116) to terminate the nitridation process. In a subsequent step, the purge gas is shut off and the reactor temperature is decreased (118). Finally, the wafer is removed from the reactor and the process ends (122, 124).

The process described above with reference to FIG. 1B advantageously removes any native oxides that may have grown during the interval between the prediffusion clean and the time when the wafers are processed. This permits the oxide grown during the incremental oxidation/anneal steps to be homogenous throughout the entire thickness and to have better uniformity in thickness. The process also permits greater uniformity in the placement of the nitridation layer by control of the oxidation layers placed before the nitridation layer. The pulsed or incremental oxidation/anneal steps described herein are believed to produce only a negligible impact on the throughput of the process.

Figure 2A:
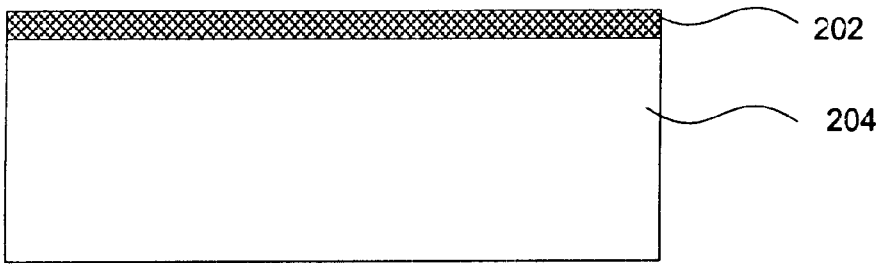
FIGS. 2A to 2E depict various stages of a structure formed by incremental oxidation and annealing in accordance with one embodiment of the present invention.
Figure 2B:
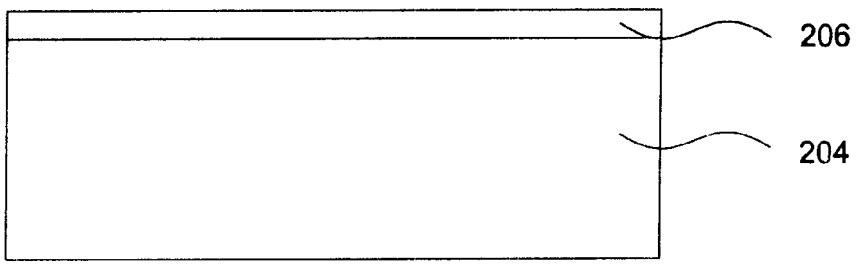

FIGS. 2A–2E depict various stages of a structure formed by incremental oxidation and annealing in accordance with one embodiment of the present invention. An initial increment of oxide growth, oxide layer 202, is formed on the substrate 204 when the substrate is exposed to the oxidizing ambient, as illustrated in FIG. 2A. The annealed oxide layer 206, as shown in FIG. 2B, has fewer defects than the oxided layer 202, due to the stress relief provided by the incremental annealing step.

Figure 2C:
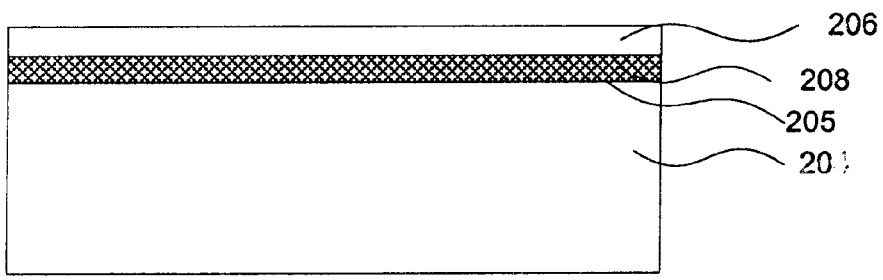
Figure 2D:
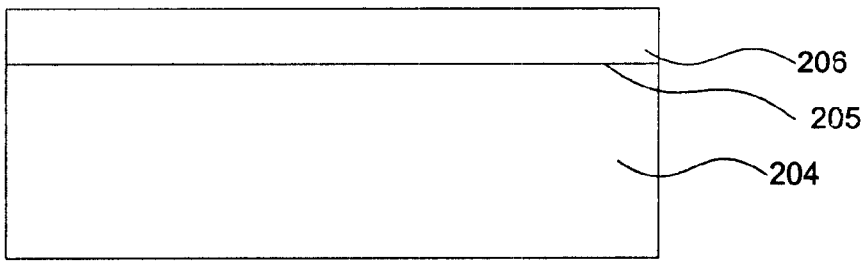

In the second cycle of incremental growth, oxide layer 208 is grown at the oxide-substrate interface 205, beneath the annealed oxide layer 206, as illustrated in FIG. 2C. The oxygen in this second incremental oxidation step and all subsequent oxidation increments diffuses through the already formed oxide and builds up at the oxide-silicon interface. After this incremental growth step, the oxide is again annealed, yielding the (now thicker) high integrity oxide 206 as illustrated in FIG. 2D.

Figure 2E:
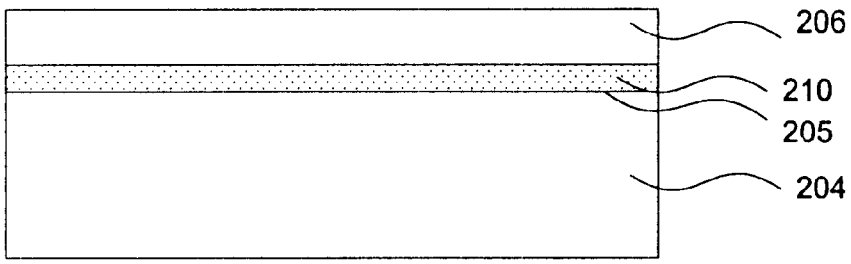

The incremental process described may also be used to nitridize the substrate to form a nitrogen rich layer at the interface 205 to prevent or retard diffusion such as from substrate dopants such as boron and phosphorus. As illustrated in FIG. 2E, the nitrogen rich 210 is formed near the oxide silicon interface 205 using the nitridizing ambient of nitric oxide (NO) or nitrous oxide ($N_2O$), typically in the presence of an inert gas such as argon (Ar) or nitrogen ($N_2$). A wide range of concentrations of nitrogen is suitable, from about 1% to about 100%. The nitrogen rich layer 210 improves the device characteristics by reducing diffusion of dopants through the oxide into the substrate.

Although the foregoing invention has been described in some detail for purposes of clarity of understanding, it will be apparent that certain changes and modifications may be practiced within the scope of the appended claims. For example, the process of the present invention is applicable to any scheme where an oxide is formed on a substrate in a semiconductor fabrication process. Accordingly, the present embodiments are to be considered as illustrative and not restrictive, and the invention is not to be limited to the details given herein, but may be modified within the scope and equivalents of the appended claims.

What is claimed is:

1. A method of forming a dielectric on a semiconductor substrate, the method comprising:
   growing a dielectric layer on a substrate in a plurality of increments, each of the plurality of increments having a thickness less than the overall thickness of the completed dielectric layer and each increment contributing a portion of the overall thickness; and
   relieving stress at the dielectric substrate interface between each increment by annealing.

2. The method as recited in claim 1 wherein the dielectric is formed in a rapid thermal processor.

3. The method as recited in claim 1 wherein the dielectric is formed in one of a vertical or horizontal batch furnace.

4. The method as recited in claim 1 wherein the relieving stress is performed by annealing the substrate.

5. The method as recited in claim 4 wherein the annealing is performed by raising the temperature surrounding the substrate and by placing the substrate in an inert environment.

6. The method as recited in claim 1 wherein the growing the dielectric comprises exposing the substrate to a process ambient.

7. The method as recited in claim 6 wherein process ambient is one of an oxidizing ambient and a nitridizing ambient.

8. The method as recited in claim 7 wherein the oxidizing ambient comprises one of dry oxidation ($O_2$), wet oxidation ($O_2+H_2$), dry oxidation with a chlorine source and the nitridizing ambient comprises one of nitrous oxide ($N_2O$) and nitric oxide (NO).

9. The method as recited in claim 1 wherein a first increment of growing the dielectric comprises exposing the substrate to a first oxidizing ambient and a second increment comprises exposing the substrate to one of a second oxidizing ambient and a nitridizing ambient.

10. The method as recited in claim 9 wherein the first oxidizing ambient is different from the second oxidizing ambient.

11. The method as recited in claim 9 wherein the first oxidizing ambient is the same as the second oxidizing ambient.

12. The method as recited in claim 9 wherein the first oxidizing ambient and the second oxidizing ambient each comprise one of dry oxidation ($O_2$), wet oxidation ($O_2+H_2$), and dry oxidation with a chlorine source, and the nitridizing ambient comprises one of nitrous oxide ($N_2O$) and nitric oxide (NO).

13. The method as recited in claim 1 wherein the relieving stress comprises an annealing operation performed while exposing the semiconductor substrate to an inert gas and raising the temperature of the substrate by about 50 to 100 degrees C. over the temperature during the growth of the dielectric in the preceeding one of the plurality of increments.

14. The method as recited in claim 1 wherein one or more incremental growing steps are followed by a growing step comprising exposing the substrate to a nitric oxide nitridizing ambient.

15. The method as recited in claim 1 wherein the dielectric formed in at least one of the increments is a monolayer.

16. The method as recited in claim 1 further comprising introducing an etchant gas prior to growing a dielectric in a plurality of increments.

17. The method as recited in claim 16 wherein the etchant gas is anhydrous HF.

18. The method as recited in claim 1 wherein a first increment of the plurality of increments of growing the dielectric comprises exposing the substrate to a first oxidizing ambient and a second increment of the plurality of increments comprises exposing the substrate to a second oxidizing ambient, wherein the first oxidizing ambient is different from the second oxidizing ambient.

* * * * *